(12) United States Patent
Guo et al.

(10) Patent No.: US 8,092,601 B2
(45) Date of Patent: Jan. 10, 2012

(54) SYSTEM AND PROCESS FOR FABRICATING PHOTOVOLTAIC CELL

(75) Inventors: George X. Guo, Palo Alto, CA (US); Kai-an Wang, Cupertino, CA (US)

(73) Assignee: Ascentool, Inc., Milpitas, CA (US)

( * ) Notice: Subject to any disclaimer, the term of this patent is extended or adjusted under 35 U.S.C. 154(b) by 1026 days.

(21) Appl. No.: 11/953,069

(22) Filed: Dec. 9, 2007

(65) Prior Publication Data

US 2008/0145521 A1 Jun. 19, 2008

Related U.S. Application Data

(60) Provisional application No. 60/869,728, filed on Dec. 13, 2006.

(51) Int. Cl.
*C23C 16/00* (2006.01)

(52) U.S. Cl. ....................................................... 118/720

(58) Field of Classification Search .................. 118/504, 118/505, 720, 721; 156/345.3; 204/298.01, 204/298.02, 298.11, 298.31
See application file for complete search history.

(56) References Cited

U.S. PATENT DOCUMENTS

| 4,715,940 A | 12/1987 | Boudreau |
| 4,800,840 A * | 1/1989 | Colton ........................... 118/721 |
| 2002/0102754 A1* | 8/2002 | Fujimori et al. ................ 438/22 |
| 2004/0163592 A1* | 8/2004 | Abiko et al. ................... 118/715 |

* cited by examiner

*Primary Examiner* — Maureen Gramaglia
(74) *Attorney, Agent, or Firm* — SV Patent Service

(57) ABSTRACT

A substrate processing system includes a source unit configured to supply a deposition material to a substrate, a substrate holder configured to hold a substrate to receive the deposition material, a shadow mask comprising a frame that includes two opposing arms; and a crossbar configured to be mounted to the two opposing arms. The frame and the crossbar define a plurality of openings that allow the deposition material supplied by the source unit to be deposited on the substrate. A transport mechanism can produce relative movement between the shadow mask and the substrate.

20 Claims, 17 Drawing Sheets

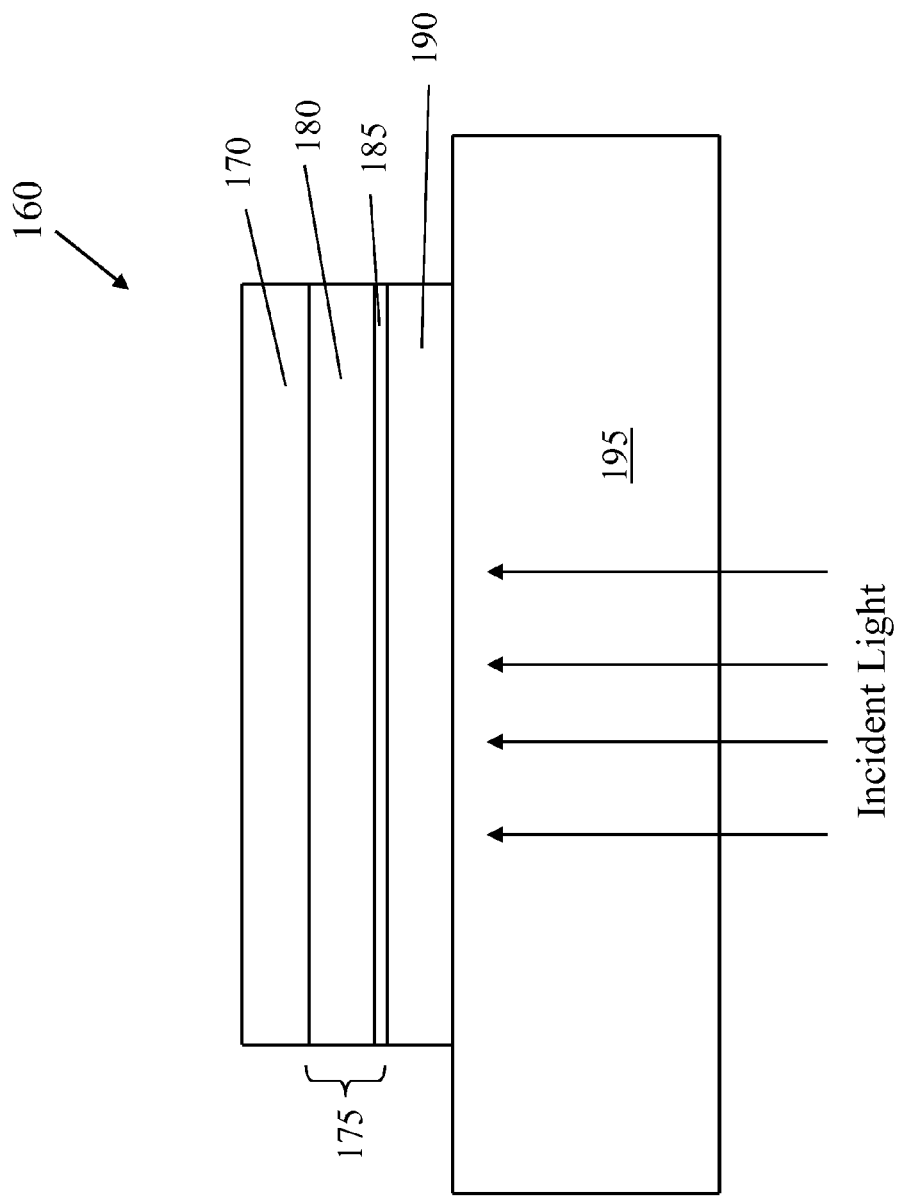

us 8,092,601 B2

SYSTEM AND PROCESS FOR FABRICATING PHOTOVOLTAIC CELL

This application claims priority to commonly assigned provisional U.S. patent application Ser. No. 60/869,728, entitled "A simplified process flow for thin film photovoltaic solar cell production", filed Dec. 13, 2006, the disclosure of which is incorporated by reference herein.

TECHNICAL FIELD

This application relates to the fabrication of multi-layer thin film devices, specifically, the fabrication of photovoltaic cells and modules.

BACKGROUND

A photovoltaic device converts light into voltage and electrical current. The voltage output of a photovoltaic device depends on its material composition and device structure. Examples of photovoltaic materials include single-crystalline silicon, poly-crystal line silicon, amorphous silicon, CdTe, CuInGaSe, etc., which can be formed in thin films. Device structures include single junction or multi-junction devices. The maximum voltage achieved for open circuit (i.e. zero current) is between 0.2 volts to 5 volts.

An exemplified single junction photovoltaic cell 100, shown in FIG. 1A, includes a transparent upper electrode 110, a PN junction 120 comprising a window layer 130 and an absorber layer 140 that are doped by opposite semiconductor types, a lower electrode 150, and a substrate 155. The transparent upper electrode layer 110 is made of a transparent conductive oxide material. Incident light passing through the upper electrode layer 110 are absorbed by the absorber layer 140, which produces electron and hole pairs. A voltage is generated between the upper electrode 110 and the lower electrode 150, which can produce a photovoltaic current when an electrical load is placed between the two electrodes. The substrate 155 can be made of metallic or insulating material, and can be transparent or opaque.

In another example, referring to FIG. 1B, a photovoltaic cell 160 includes a upper electrode 170, a PN junction 175 comprising an absorber layer 180 and a window layer 185, a lower electrode 190, and a substrate 195. The upper electrode 170 is not required to be transparent. The substrate 195 is made of a transparent material such glass. The absorber layer 180 and the window layer 185 are typically made of oppositely doped semiconductor materials. The lower electrode layer 190 is made of a transparent conductive oxide material. Incident light passing through the substrate 195 and the lower electrode layer 190 are absorbed by the absorber layer 180, which produces electron and hole pairs. A voltage is generated between the upper electrode 170 and the lower electrode 190, which can produce a photovoltaic current when an electrical load is placed between the two electrodes.

The photovoltaic cells are connected in series to increase the output voltage and to reduce internal power loss caused by heating which is proportional to the square of the total current. Each photovoltaic cell can constitute a small portion of a solar power module to minimize the total current generated. A solar power module, for example, can include ten or more serially connected photovoltaic cells. In one implementation, thin-film layers deposited on a substrate of a photovoltaic device are divided into separate photovoltaic cells. The upper electrode of a photovoltaic cell is electrically connected to the lower electrode of an adjacent photovoltaic cell, thereby forming a solar power module comprising serially connected photovoltaic cells.

FIGS. 2A and 2B are respectively cross-sectional and perspective views of an exemplified solar-cell module 200 comprising three serially connected photovoltaic cells 210, 220, 230 on a substrate 205. The photovoltaic cell 210 includes a lower electrode 211 on the substrate 205, a PN junction 212, and an upper electrode 213. Similarly, the photovoltaic cells 220 and 230 include respectively lower electrodes 221, 231 on the substrate 205, PN junctions 222, 232 respectively on the lower electrodes 221, 231, and upper electrodes 223, 233 respectively on the PN junctions 222, 232. The substrate 205 and the lower electrodes 211, 221, 231 can be transparent to allow transmission of incident light to the PN junctions 212, 222, 232. Alternatively, the upper electrodes 213, 223, 233 can be made of a transparent conductive material such as a conductive oxide. The upper electrode 223 in the photovoltaic cell 220 is connected to the lower electrode 211 in the photovoltaic cell 210. The upper electrode 233 in the photovoltaic cell 230 is connected to the lower electrode 223 in the photovoltaic cell 220.

The manufacturing process for the solar-cell module 200 can include depositions of multiple layers for the lower electrodes 211, 221, 231, PN junctions 212, 222, 232, and upper electrodes 213, 223, 233. The layers can be scribed mechanically, by patterning, or by a laser.

One disadvantage of the above described manufacturing process is that a cleaning step is typically needed after each patterning step to remove the debris generated during patterning. Another disadvantage is that the cutting through many layers of the film often causes current leakage between layers and electrical shorting of the photovoltaic cells. Yet another disadvantage of the above described patterning process is that the roughness of the cut or etched surface may lead to lower electrical performance and cause failures in the solar-cell modules. In addition, some conventional solar-cell modules require high transparency for use as windows in buildings. The cost for patterning is high since a large portion of deposited films has to be removed.

The above described disadvantages can increase manufacturing complexity and costs, or decrease the reliability of the solar-cell modules or photovoltaic cells. There is therefore a need for a simpler and more reliable system for manufacturing solar-cell modules or photovoltaic cells.

SUMMARY

In one aspect, the present invention relates to a substrate processing system including a source unit that can supply a deposition material to a substrate; a substrate holder that can hold a substrate to receive the deposition material; a shadow mask including a frame that includes two opposing arms; and a crossbar that can be mounted to the two opposing arms, wherein the frame and the crossbar define a plurality of openings that allow the deposition material supplied by the source unit to be deposited on the substrate; and a transport mechanism that can produce relative movement between the shadow mask and the substrate.

In another aspect, the present invention relates to a shadow mask for defining deposition patterns on a substrate. The shadow mask includes a frame comprising two opposing arms and a crossbar that can be mounted to the two opposing arms, wherein the frame and the crossbar define a plurality of openings that can pass a deposition material to a substrate.

In another aspect, the present invention relates to a method for fabricating a solar-cell module. The method includes positioning a shadow mask over a substrate having a first lower electrode layer and a second lower electrode layer separated from the first lower electrode layer, wherein the first lower electrode layer and the second lower electrode layer comprise a first conductive material, wherein the shadow mask comprises a first opening over the first lower electrode layer and a second opening over the second electrode layer; depositing one or more semiconductor materials through the first opening to form a first PN junction structure on the first lower electrode layer and through the second opening to form a second PN junction structure on the second lower electrode layer; producing a first translation between the shadow mask and the substrate; and depositing a second conductive material through the first opening and the second opening to form a first upper electrode layer on the first PN junction structure and partially on the second lower electrode layer, and to form a second upper electrode layer on the second PN junction structure.

Implementations of the system may include one or more of the following. The substrate processing system of claim 1, wherein the crossbar comprises an elongated portion and a mounting member at an end of the elongated portion, wherein the mounting member can be mounted to the two opposing arms. The crossbar can further include a spring that can pull the mounting member against the one of the two opposing arms to securely mount the crossbar across the two opposing arms. The crossbar can include an elongated portion, two mounting members at two ends of the elongated portion, and a spring, wherein the mounting members are configured to be respectively mounted to the two opposing arms, wherein the spring can pull the mounting member against the one of the two opposing arms to securely mount the crossbar across the two opposing arms. The crossbar can include high temperature alloys such as INCONEL, stainless steel, alloys such as KOVAR which have similar thermal expansion as substrate such as glass, alloys such as INVAR which have near zero thermal expansion coefficient in certain temperature range, steel, Titanium, Mo, or W. The frame can include Stainless steel, steel, aluminum, titanium, alloys such as KOVAR which have similar thermal expansion as substrate such as glass, or alloys such as INVAR which have near zero thermal expansion coefficient in certain temperature range. A thermal expansion coefficient of the crossbar can be lower than a thermal expansion coefficient of the frame. The crossbar can have a width in a range of about 0.02 millimeter and about 2 millimeters, wherein the shadow mask is positioned at a distance smaller than about 2 millimeters from the substrate. The shadow mask and the crossbar can be substantially co-planar. The shadow mask further can include a plurality of substantially parallel crossbars mounted across the two opposing arms.

Embodiments may include one or more of the following advantages. The disclosed systems and methods provide simpler, cleaner, and more reliable processes for manufacturing solar-cell modules or photovoltaic cells comparing to some conventional manufacturing systems. The disclosed systems and methods do not produce debris as in the patterning process in some conventional systems, as described above. The disclosed systems and methods thus can eliminate the cleaning steps for removing the debris in those conventional systems. The disclosed systems and methods also do not involve cutting thin film layers as conducted in some conventional systems. The disclosed systems and methods can thus avoid current leakage and electrical shorting in those photovoltaic cells or modules made by conventional systems. Additionally, the disclosed systems and methods do not include the roughness associated with cutting or etching on the surface after patterning in those conventional systems. The performance can thus be improved and manufacturing costs of the solar-cell modules can be reduced using the disclosed systems and methods.

Another advantage of the disclosed system and methods is that multiple layers in photovoltaic cells can be fabricated in continuous processing. The modules do not need to be disassembled for patterning and re-assembling for subsequent deposition steps as in some convention systems. Manufacturing throughput and cost are thus improved.

The details of one or more embodiments are set forth in the accompanying drawings and in the description below. Other features, objects, and advantages of the invention will become apparent from the description and drawings, and from the claims.

BRIEF DESCRIPTION OF THE DRAWINGS

FIG. 1B is a cross-sectional view of another exemplified single-junction photovoltaic cell.

DETAILED DESCRIPTION

Figure 1A:
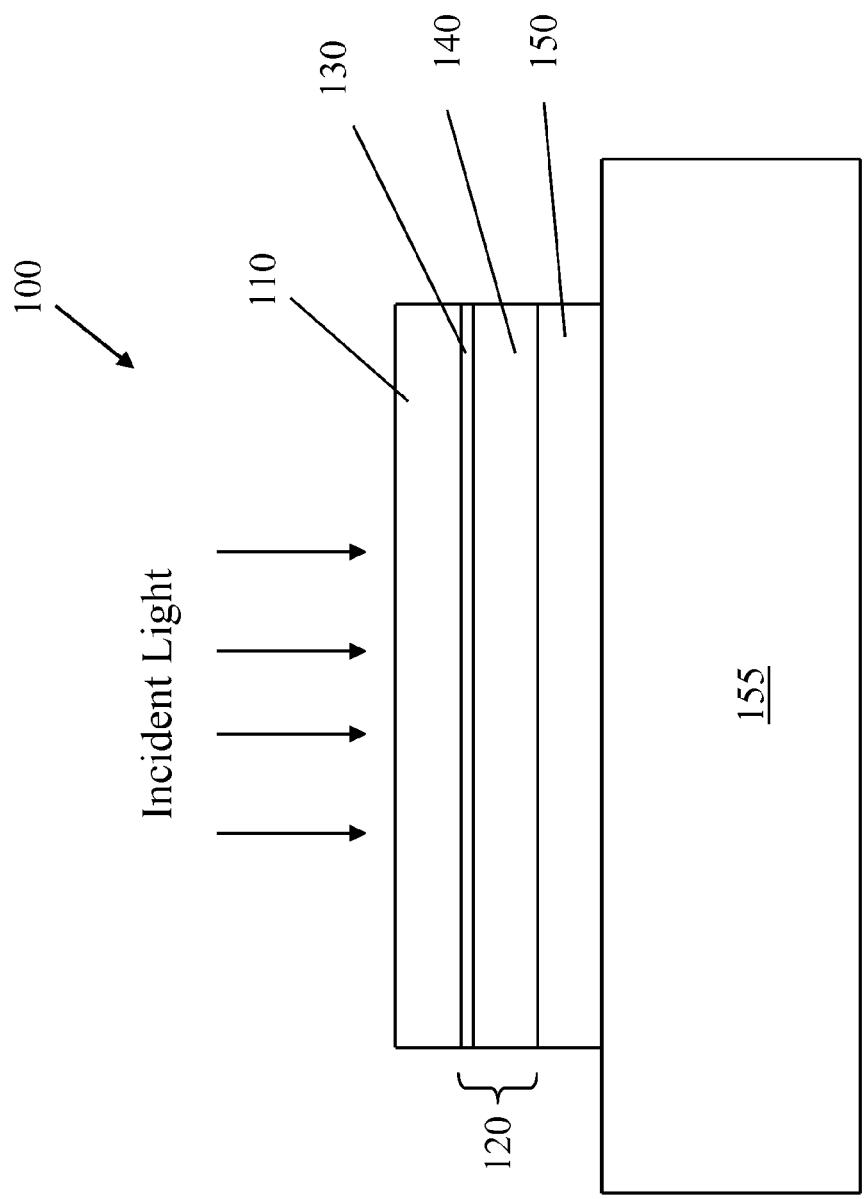
FIG. 1A is a cross-sectional view of an exemplified single-junction photovoltaic cell.
Figure 2A:
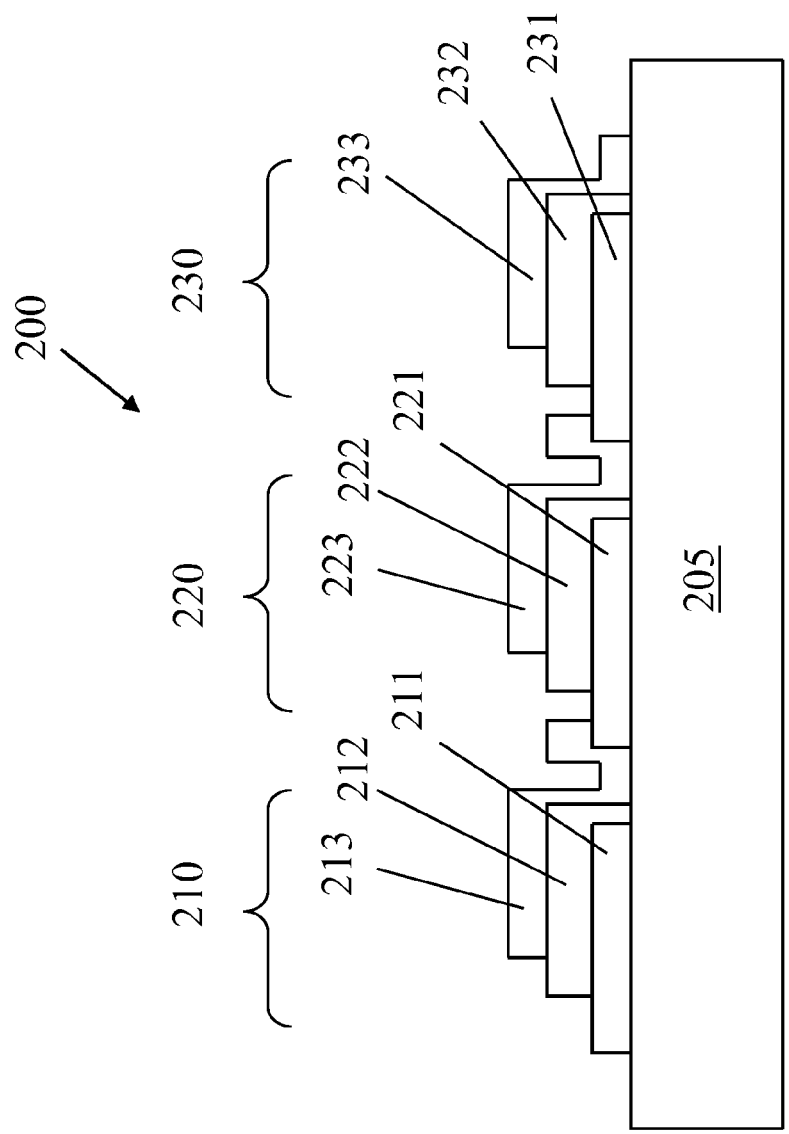
FIG. 2A is a cross-sectional view of an exemplified solar-cell module comprising serially connected photovoltaic cells.
Figure 2B:
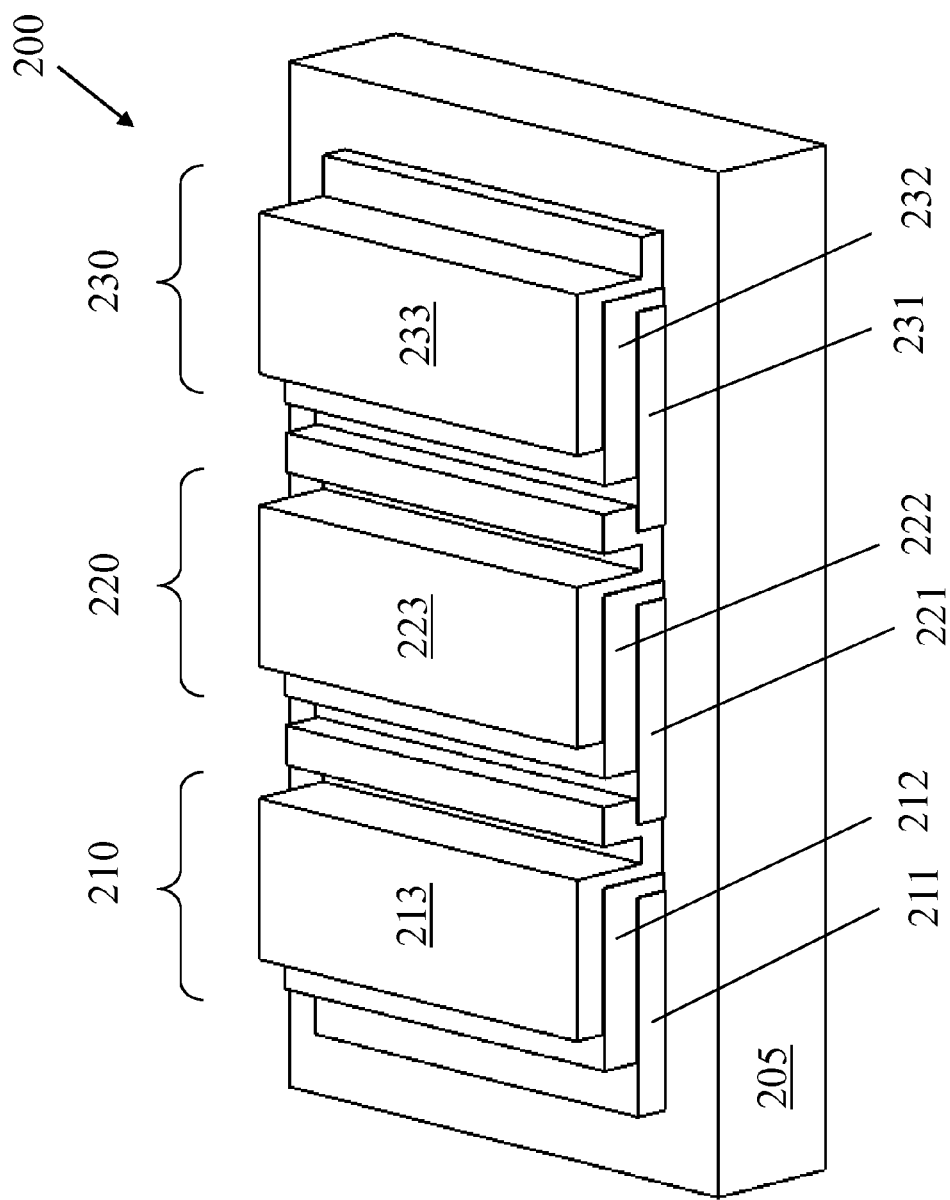
FIG. 2B is a perspective view of the exemplified solar-cell module in FIG. 2A.
Figure 3A:
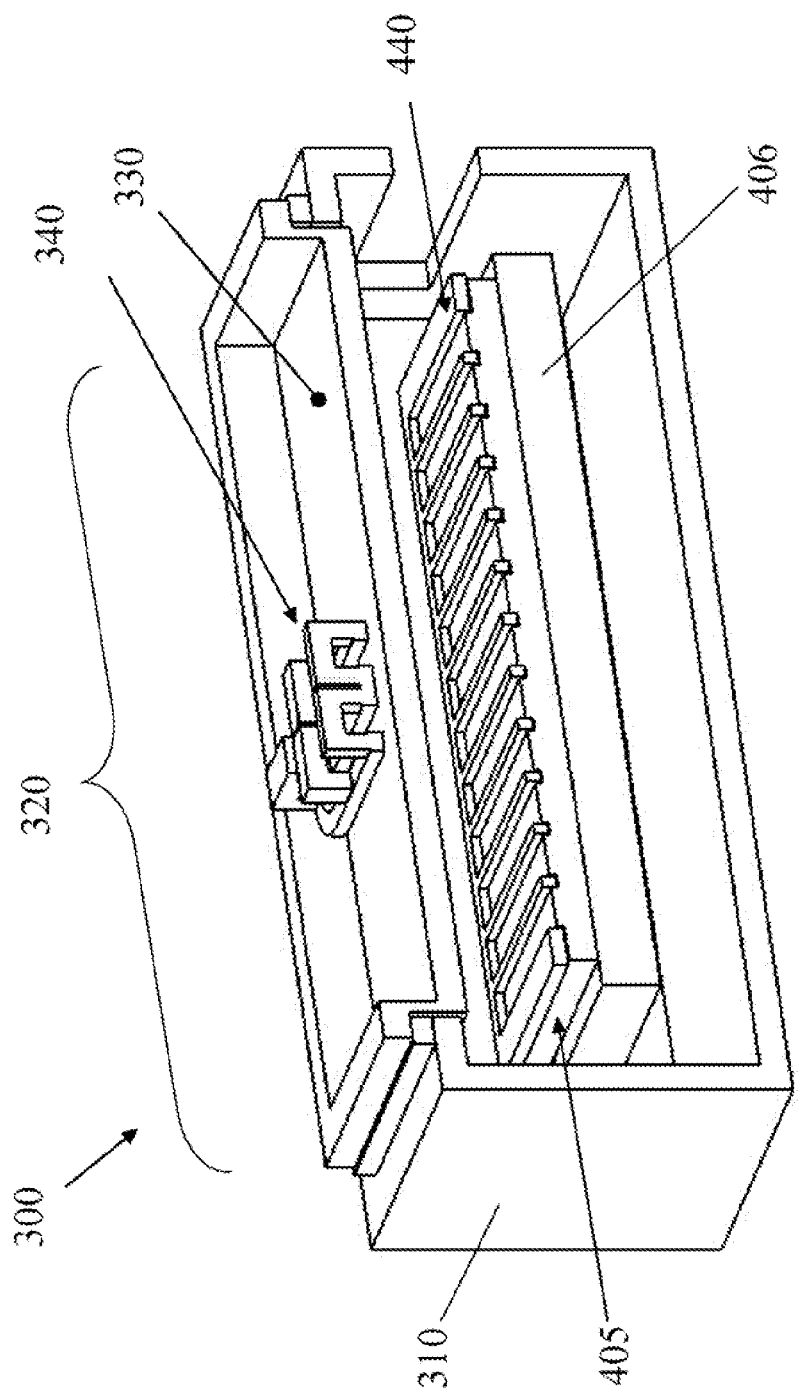
FIG. 3A is a perspective view of an exemplified substrate processing system in accordance with the present specification.
Figure 3B:
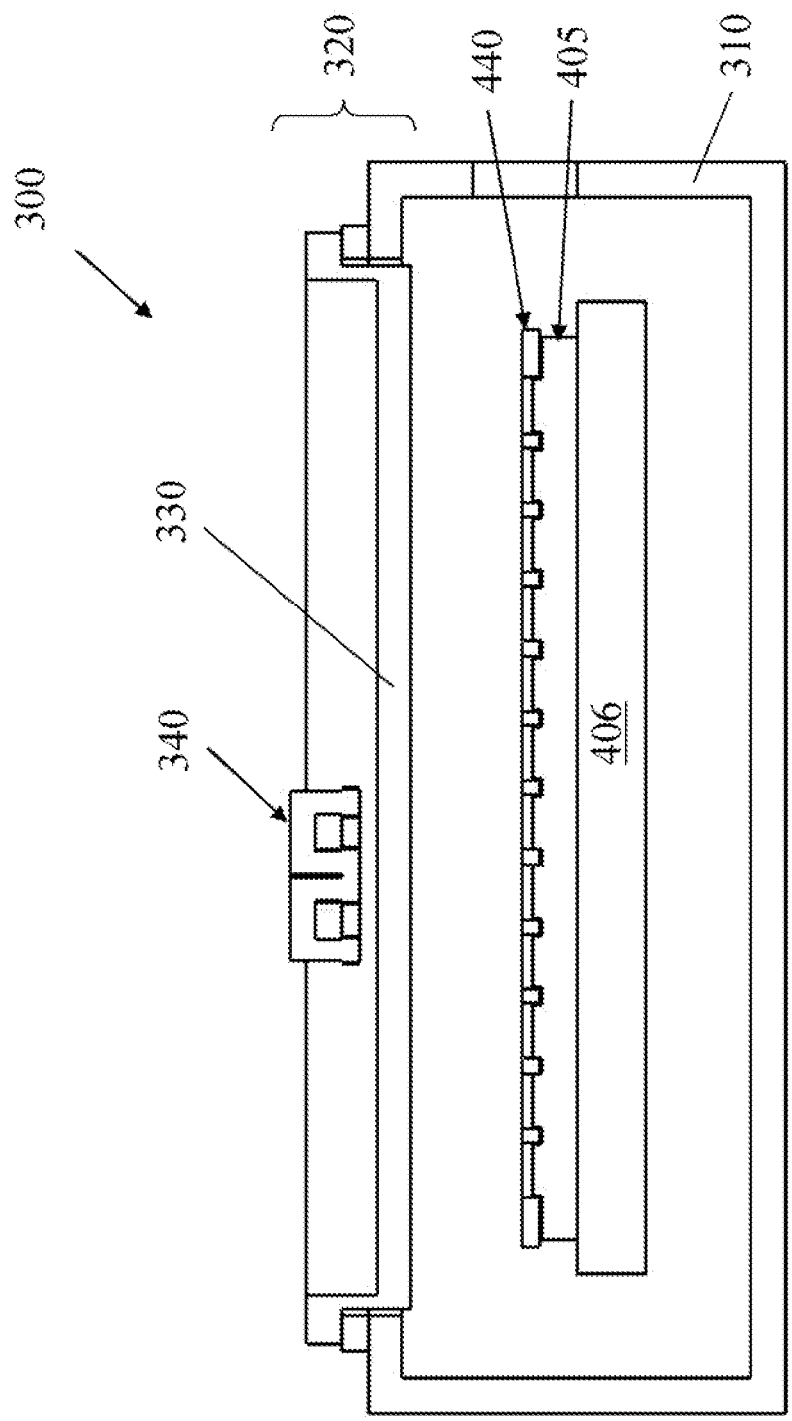
FIG. 3B is a cross-sectional view of an exemplified substrate processing system in FIG. 3B.

An exemplified substrate processing system 300, referring to FIGS. 3A and 3B, includes a chamber 310, a substrate holder 406, a substrate 405 held by the substrate holder 406, a shadow mask 440 held over the substrate 405, and a source unit 320. The source unit 320 can for example include a target 330 for providing a material to be deposited on the substrate 405 and a magnetron 340 configured for providing a magnetic field near a surface of the target 330 where the target material is sputtered off. The source unit 320 can also include an evaporation source, a sublimation source for physical vapor deposition (PVD), a gas distribution plate or a shower head for chemical vapor deposition. The substrate processing system 300 can further include a vacuum pump configured to exhaust air from the chamber 310 to produce a vacuum environment suitable for substrate processing. The chamber 310 can also be filled with a gas to assist substrate processing. The substrate can be held and transported by a transport mechanism in and out of the chamber 310. The substrate processing system 300 can include a heating mechanism configured to heat the substrate 405 to an elevated temperature such as 100 C to 600 C to prepare it for processing.

Figure 4A:
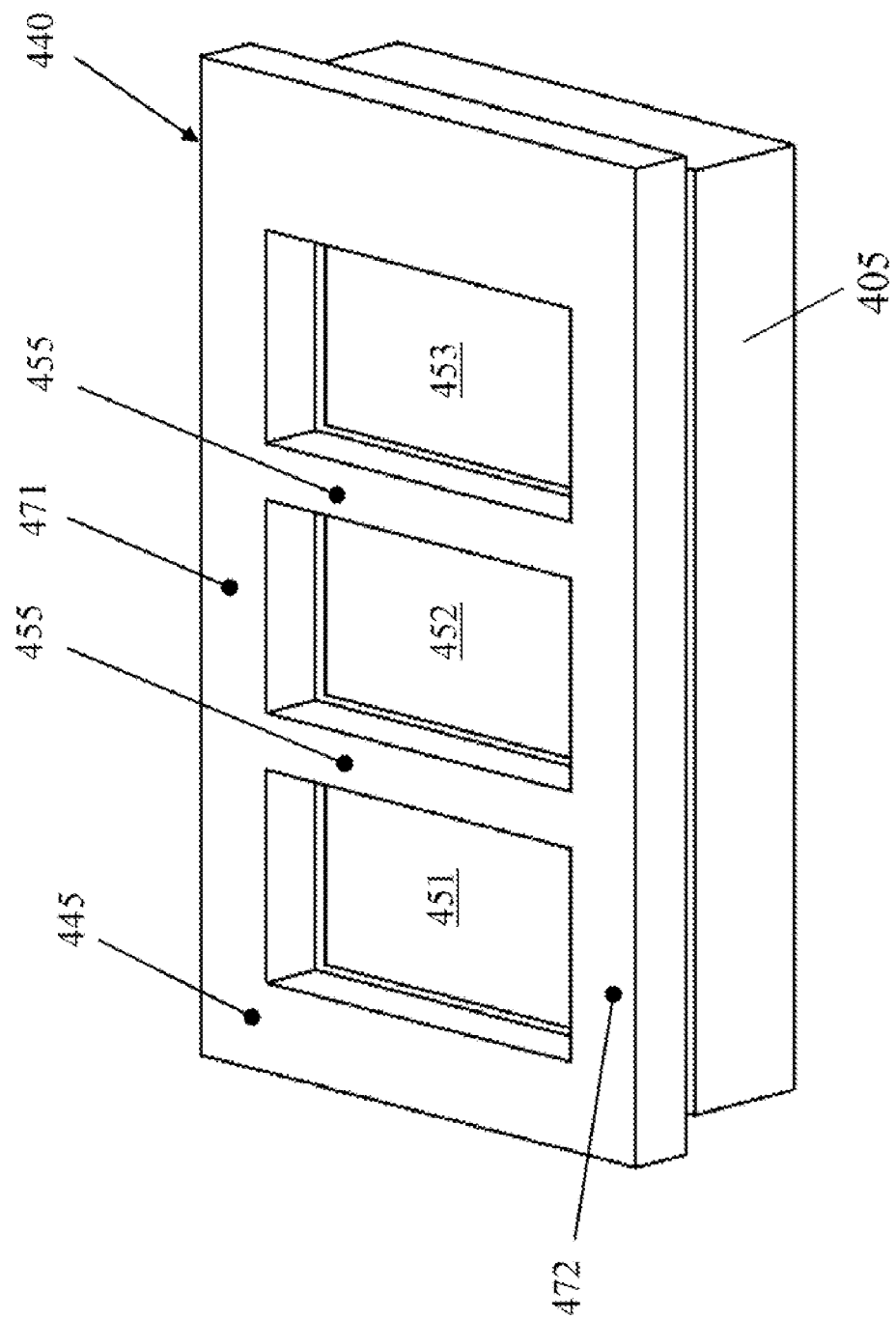
FIG. 4A is a perspective view of the shadow mask and the substrate in the substrate processing system of FIGS. 3A and 3B.
Figure 4B:
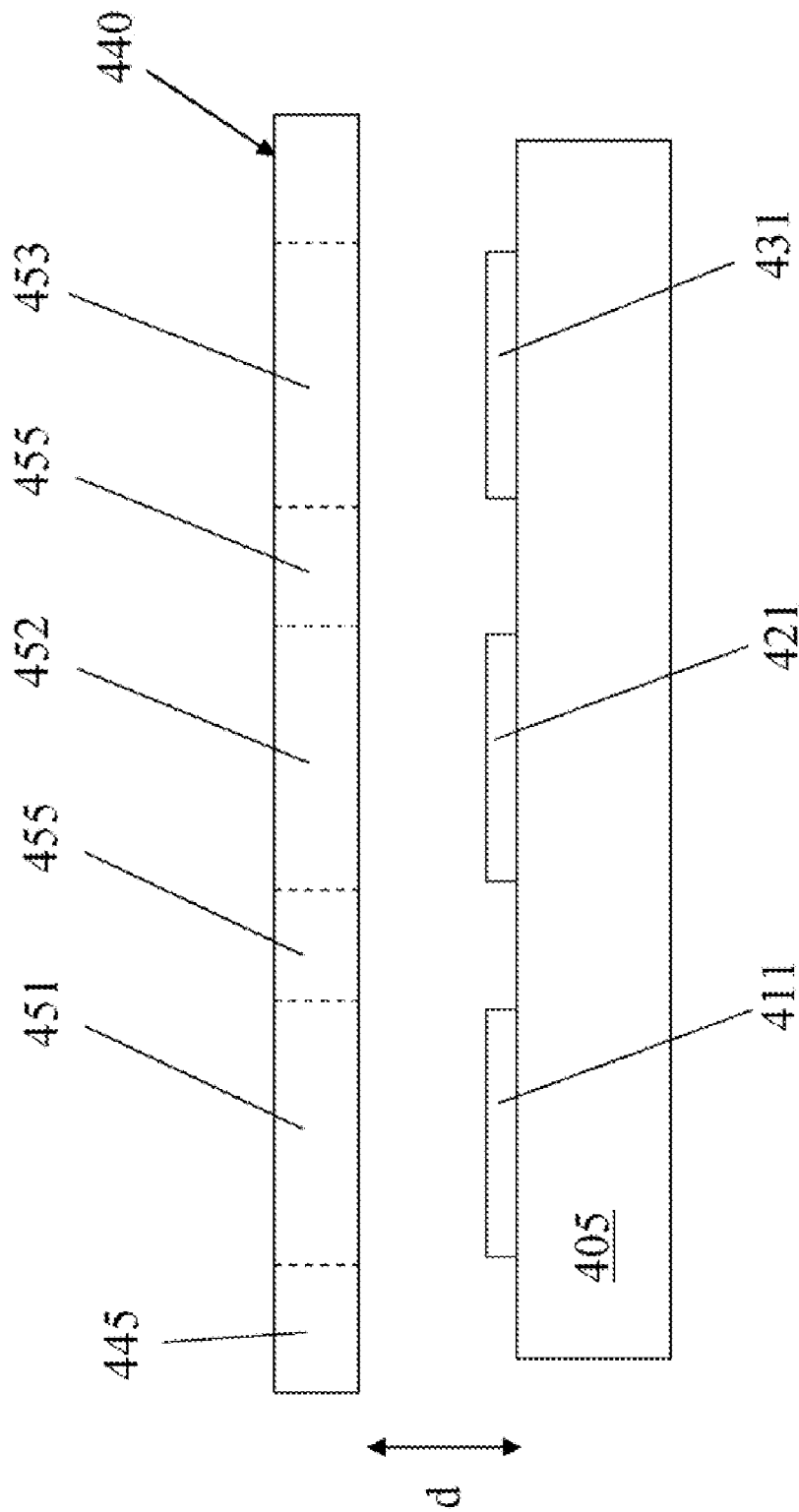
FIG. 4B is a cross-sectional view showing the deposition of lower electrodes on the substrate using the shadow mask.

Referring to FIGS. 4A and 4B, the shadow mask 440 positioned over the substrate 405 includes a rigid frame 445 and openings 451, 452, and 453. (For illustration purpose, the dimensions such as the thicknesses of the crossbars and the rigid frame are not to scale in FIGS. 4A and 4B.) The openings 451, 452, and 453 are separated by crossbars 455. The shadow mask 440 and the crossbars 455 can be substantially co-planar and positioned parallel to the upper surface of the substrate 405. The openings 451, 452, and 453 in the shadow mask 440 allow materials from the source unit to be deposited on the substrate 405 through while blocking material deposition by the rigid frame 445 and the crossbars 455. The selective blocking of material deposition can produce mutually isolated deposition layers on the substrate 405. The shadow mask 440 can be used alone or in combination with additional mask(s) to define deposition patterns.

The shadow masks 440 can be formed by a single piece of material or an assembly of multiple components. The frame 445 can be in a form of a close loop or a partial loop. In some embodiments, the rigid frame 445 includes opposing arms 471, 472, which can be substantially parallel to one another. Each of the crossbars 455 is mounted or connected to both arms 471, 472. The crossbars 455 can be substantially parallel to each other with separation distance ranging from 3 mm to 100 mm. The crossbars 455 can have a thickness between 0.02 millimeter and 2 millimeter. The crossbars 455 can be formed by wires, strings, or wires with integrated or attached spring, ribbons, or stripes. The crossbars 455 can be made of high temperature alloys such as INCONEL, stainless steel, alloys such as KOVAR which have similar thermal expansion as substrate such as glass, alloys such as INVAR which have near zero thermal expansion coefficient in certain temperature range, steel, Mo, W, Titanium, and other materials. The rigid frame 445 can be made of materials with similar thermal expansion coefficient to that of substrate 405, such that the relative positions among the substrate 405, the frame 445, and the crossbars 455 are substantially unchanged at elevated temperatures. The frame 445 can be made of alloys such as KOVAR which have similar thermal expansion as substrate such as glass, steel, alloys such as INVAR which have near zero thermal expansion coefficient in certain temperature range, aluminum, titanium or other materials.

The crossbars 455 can be flexible and mounted in tension onto the rigid frame 455 to keep them straight. These crossbars 455 can be fixed on the rigid frame 445 by mounting members such as hooks, fasteners, welding, or other means. The cross-sections of the crossbars 455 can be round, square, polygon or other shapes. The crossbars 455 can be mounted in a direction parallel, vertical, or tilted relative to the gravitation direction.

Figure 5A:
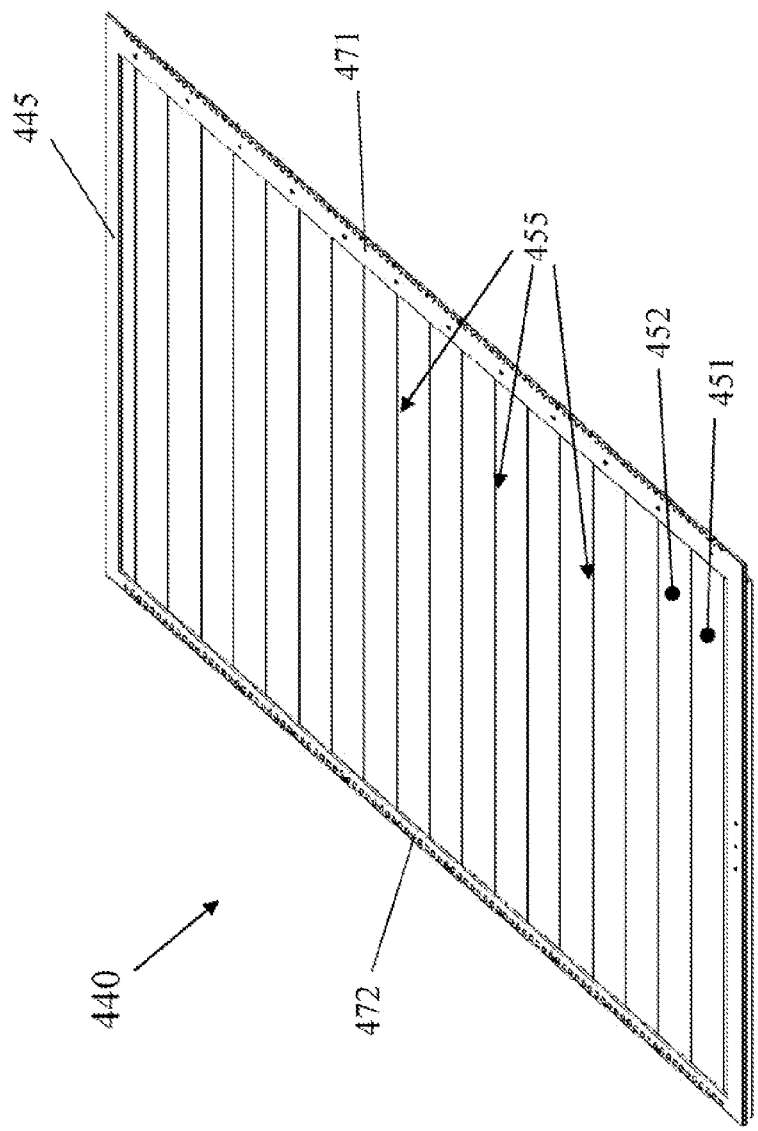
FIG. 5A is a perspective view of an exemplified shadow mask compatible with the substrate processing system and processes shown in FIG. 3A-4D.
Figure 5B:
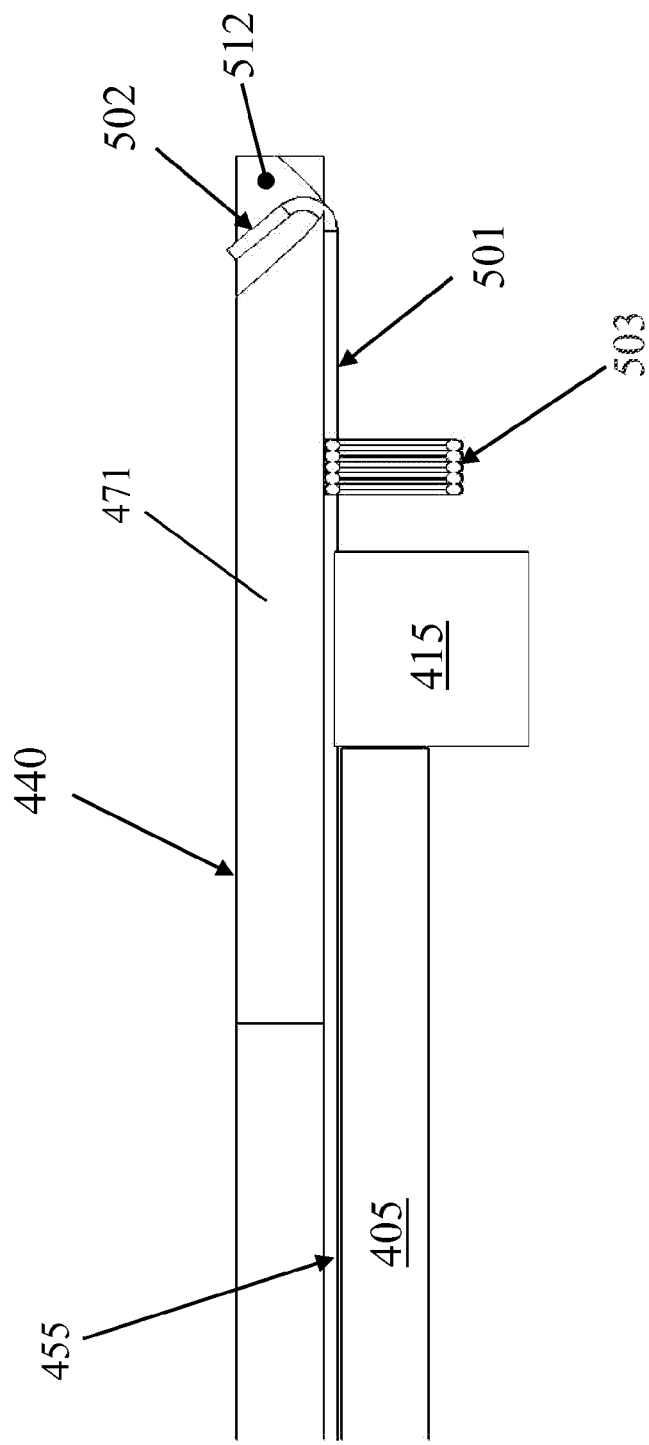
FIG. 5B is a detailed cross-sectional side view of a portion of the shadow mask held by a substrate holder and over a substrate.
Figure 5C:
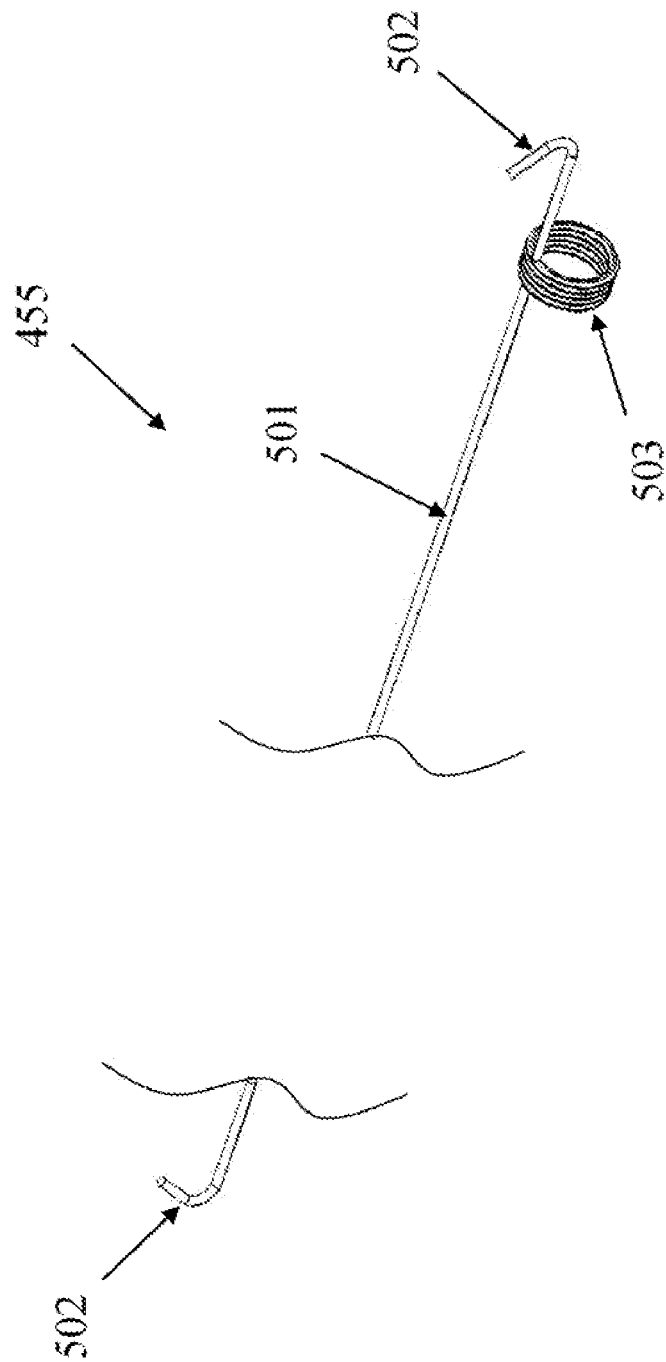
FIG. 5C is a perspective view of a crossbar including an integrated spring.
Figure 5D:
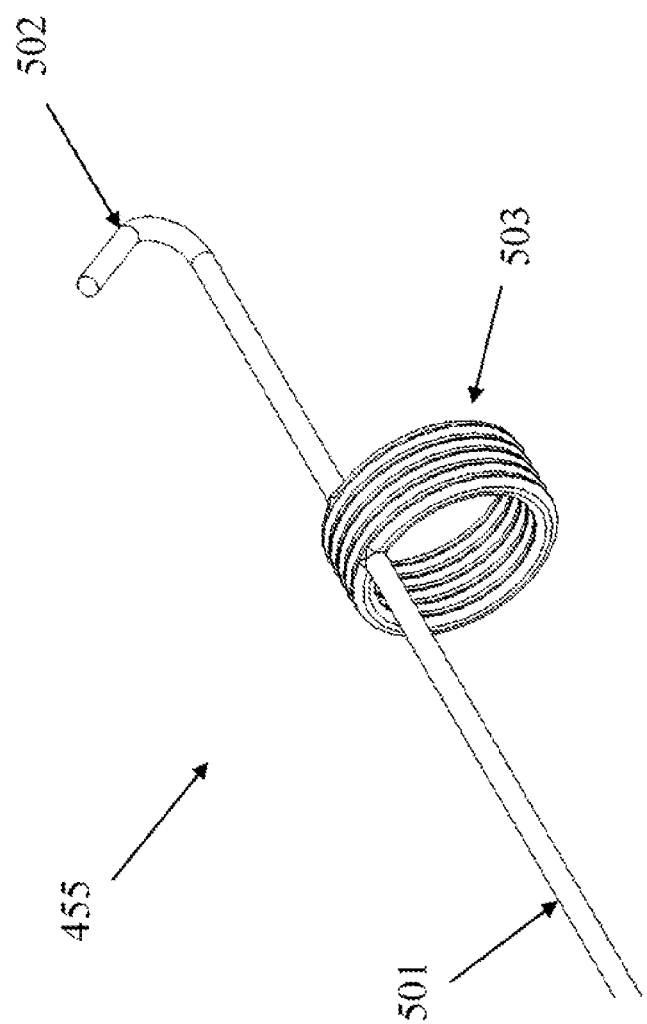
FIG. 5D is a detailed perspective view of the crossbar in FIG. 5C.
Figure 5E:
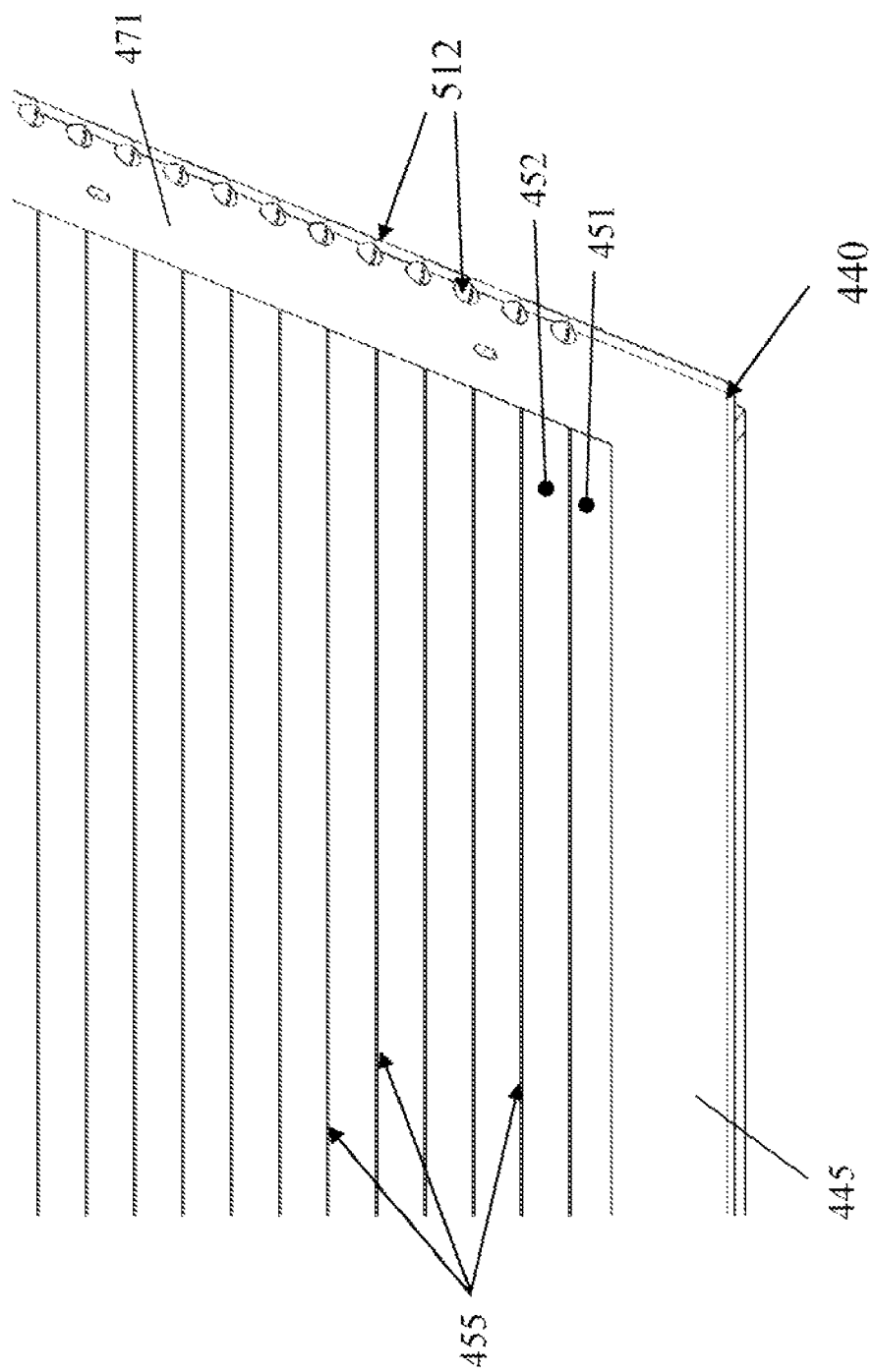
FIG. 5E is a perspective view of an edge portion of the shadow mask shown in FIGS. 5A-5B.
Figure 5F:
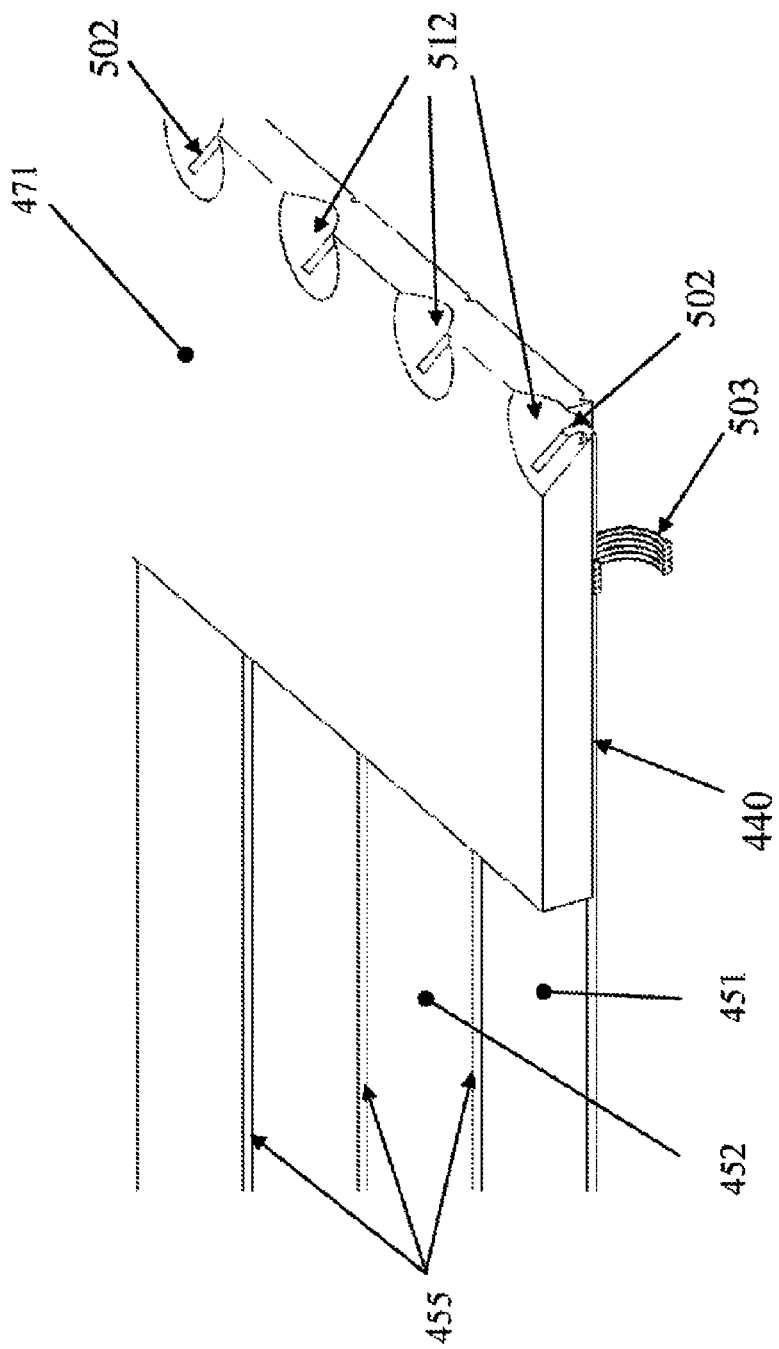
FIG. 5F is a detailed perspective cross-sectional view of an edge portion of the shadow mask shown in FIGS. 5A-5B and 5E.
Figure 6:
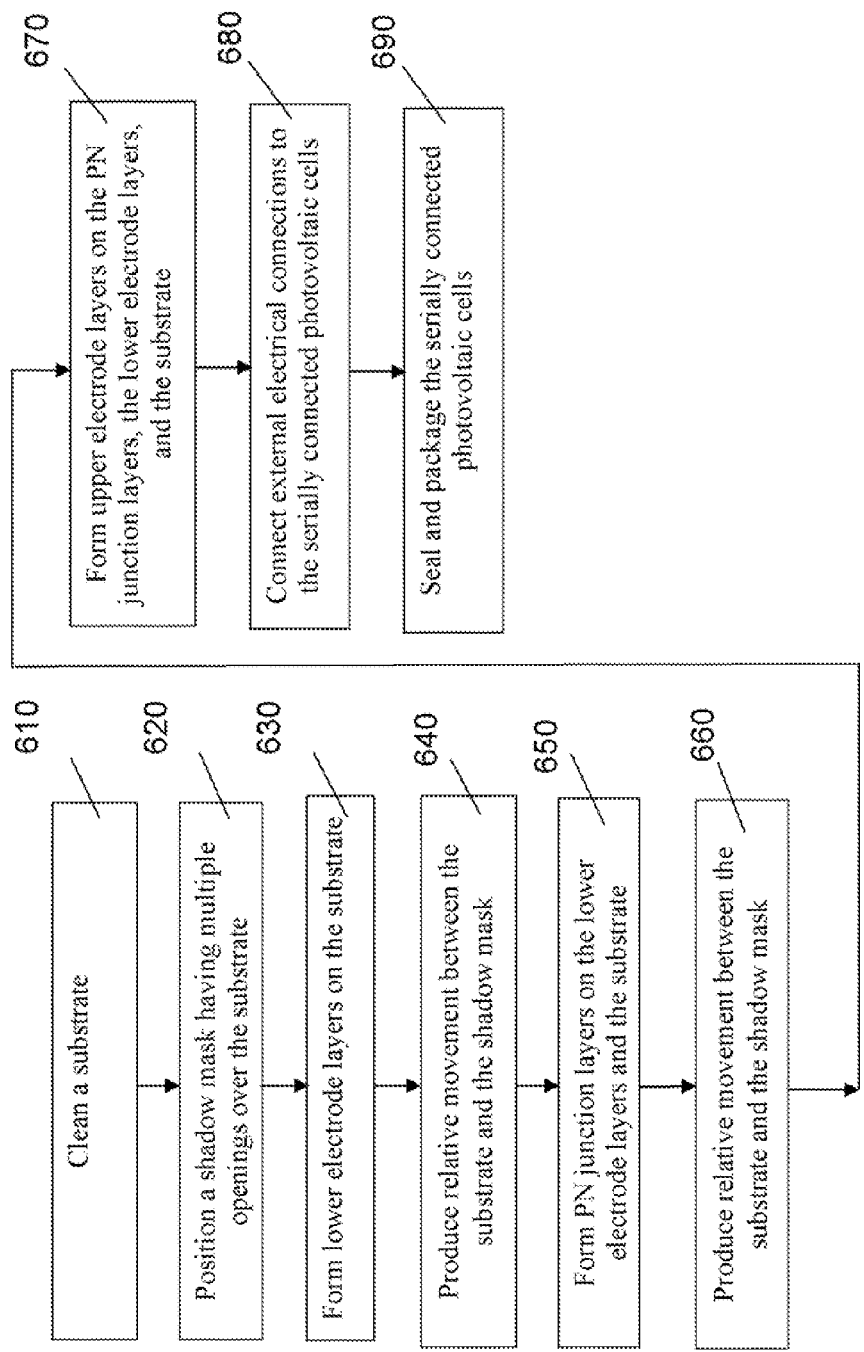
FIG. 6 is a flow diagram for the substrate processing system and processes shown in FIGS. 3A-5F.

In some embodiments, an exemplified shadow mask 440 is shown in FIG. 5A. The shadow mask 440 includes a rigid frame 445 that includes two rigid opposing arms 471, 472. A plurality of crossbars 455 are mounted between the two opposing arms 471, 472, which define a plurality of openings 451, 452 between the crossbars 455 and the rigid frame 445. Referring to FIG. 5B, the substrate 405 is held by a substrate holder 415. The substrate holder 415 can be held and moved by a transport mechanism in and out of processing chamber 310. The shadow mask 440 is attached to the substrate holder 415.

Referring to FIGS. 5B-5F, the crossbar 455 includes an elongated portion 501, one or two hooks 502 at one or two ends of the elongated portion 501, and a spring 503 that integrated with or separated from the elongated portion 501. The crossbar 455 can be mounted on the rigid frame 445 by respectively positioning the hooks 502 into mounting holes 512 formed on the outer edges of the opposing arms 471 or 472. The springs 503 is stretched to pull the hooks 502 against the outer edges of the opposing arms 471 or 472, which holds the crossbar 455 securely to the rigid frame 445. The tension also keeps the crossbar 455 straight and prevents sagging and deformation in the crossbar 455 even at elevated temperatures.

The shadow mask 440 can be attached to the substrate 405 or the substrate holder 415 by fasteners, hook, adhesives, magnetic force, gravity or electro static forces. For example, the shadow mask 440 can be made of magnetic or Ferromagnetic material, to allow the shadow mask 440 to be held against the substrate holder 415 by a magnetic force.

Since some processing of the substrate 405 may be done at elevated temperatures, the shadow mask 440 can be made of materials with thermal expansion rates that match that those of the substrate 405. The relative position between substrate 405 and shadow mask 440 can thus be maintained at various temperatures during the processing. For a glass substrate, a material such as Stainless steel, steel, aluminum, alloys such as KOVAR which have similar thermal expansion as substrate such as glass, or alloys such as INVAR which have near zero thermal expansion coefficient in certain temperature range, can be selected for the shadow mask 440. In some embodiments, the material for the crossbars 455 are selected to have a lower thermal expansion rate compared to the rigid frame 445 to keep the crossbar 455 straight during elevated processing temperatures. That is, the thermal expansion coefficient of the crossbars 455 is lower than that of the rigid frame 445. For example, the thermal expansion coefficients of the crossbars 455 and the rigid frame 445 can be both positive, with the one for the crossbars 455 having a smaller value. In another example, the crossbars 455 have a negative thermal expansion coefficient and the rigid frame 445 has a positive thermal expansion coefficient. As temperature increase in the chamber 310, the rigid frame 445 expands faster than the crossbars 455, thus increasing the tension in the springs 502 built in the crossbars 455, which in turn renders stronger forces to hold the crossbars 455 to the rigid frame 445. In some embodiments, the crossbars 455 with the springs 502 keep the crossbar 455 in tension and straight when the crossbars 455 expand more than the frame 445.

The distance d between the shadow mask 440 and the substrate 405 can be controlled to allow accurate positions of depositions through the openings 451-453 onto the substrate 405. The distance d can for example be set in less than 2 millimeters when the crossbars 455 have widths in a range of about 0.02 millimeter and about 2 millimeters. The relative space distance d is selected to ensure precise deposition layers and sharply defined edge in the deposition layers on the substrate 405. In some embodiments, the shadow mask 440 can be held in contact with the substrate 405. The crossbars 455, as described above, are fixedly mounted to the rigid frame 445 to prevent relative movement between the crossbars 455 and the rigid frame 445 during processing of the substrate 405. In this way, the shadow mask 440 allows consistent deposition patterns to be formed on the substrate 405 during different processing steps.

An advantage of the shadow mask is that the same shadow mask can be used for multiple processing steps. Additional shadow masks may be used to further restrict the deposition area in some of the steps to avoid shorting between various layers. Referring to FIGS. 4B-4D, and FIG. 6, the substrate 405 is first cleaned (step 610). The substrate 405 can be formed by a transparent material if the incident light to be received from below for the solar cell module to be formed. The substrate 405 can be either transparent or opaque if the incident light is to be received from above. The shadow mask 440 is positioned over the substrate 405 (step 620). Lower electrode layers 411, 421, 431 are deposited on the substrate 405 (step 630). The lower electrode layers 411, 421, 431 are formed by conductive materials such as conductive oxide materials. The crossbars 455 define the gaps separating the lower electrode layers 411, 421, 431. The distances between the lower electrode layers 411, 421, 431 can be adjusted by selecting the widths of the crossbars 455. The rigid frame 445 defines the outer boundaries of the lower electrode layers 411, 421, 431.

Figure 4C:
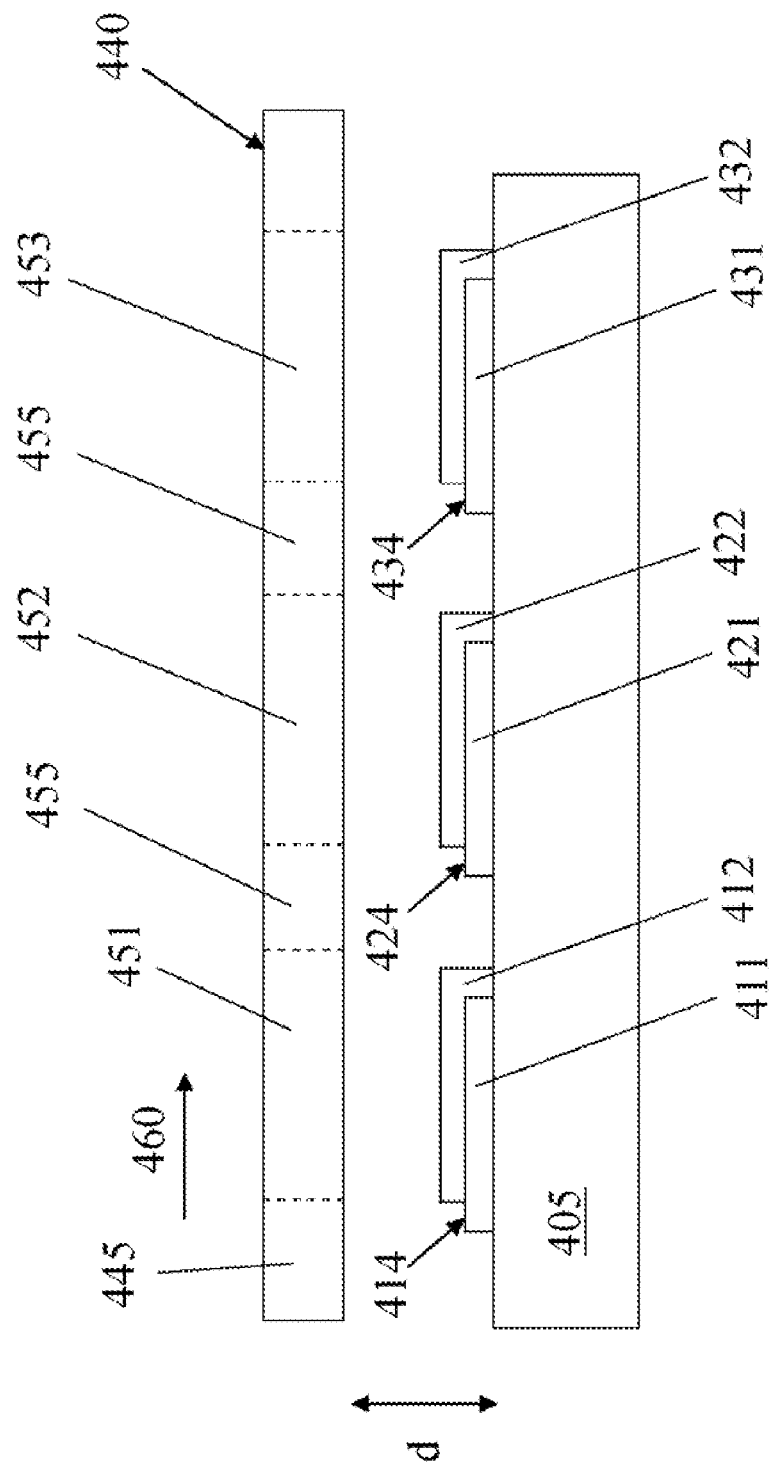
FIG. 4C is a cross-sectional view showing the deposition of PN junctions on the lower electrodes and the substrate using the shadow mask.

A relative movement is next produced between the substrate 405 and the shadow mask 440 in a direction parallel to the surface of the substrate 405 (FIG. 4C, step 640). The relative movement can be produced by either moving the substrate 405, or the shadow mask 440, or a combination thereof. For example the shadow mask 440 can be translated in a direction 460 parallel to the upper surface of the substrate 405.

A plurality of PN junction layers 412, 422, and 432 are respectively deposited on the lower electrode layers 411, 421, 431 and the substrate 405 (FIG. 4C, step 650). The PN junction layers 411, 421, 431 can each include CdS and CdTe, CdS, CuInGaSe, silicon, amorphous silicon, etc. Each PN junction layers 412, 422, or 432 can cover a major portion of the corresponding lower electrode layers 411, 421 or 431 while leaving an area 414, 424 or 434 exposed along the edge of the corresponding lower electrode layers 411, 421 or 431.

Figure 4D:
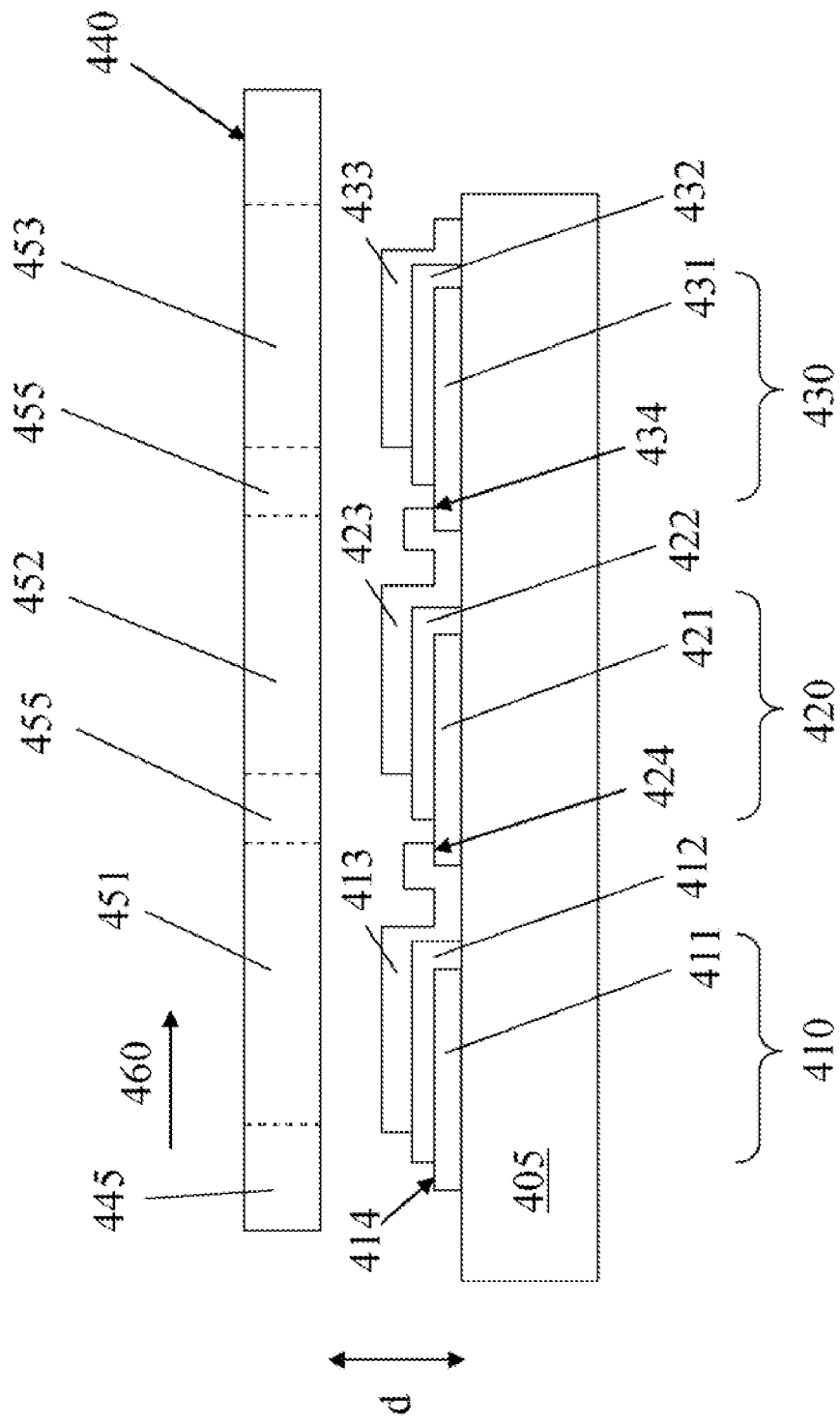
FIG. 4D is a cross-sectional view showing the deposition of upper electrodes on the PN junctions, the lower electrodes, and the substrate using the shadow mask.

Another relative movement is next produced between the substrate 405 and the shadow mask 440 in a direction parallel to the surface of the substrate 405 (FIG. 4D, step 660). The relative movement can for example be produced by translating the shadow mask 440 in the direction 460 parallel to the upper surface of the substrate 405.

A plurality of upper electrode layers 413, 423, 433 are respectively deposited on the PN junction layers 412, 422, and 432 and the substrate 405 (FIG. 4C, step 670). The upper electrode layers 413, 423, 433 are formed by a conductive material such as a conductive oxide material. The translation of the shadow mask 440 allows the upper electrode layer 413 to be partially formed on the surface 424 on the lower electrode layer 421, which electrically connects the upper electrode layers 413 and the lower electrode layer 421. Similarly, the upper electrode layer 423 is partially formed on the surface 434 on the lower electrode layer 431. Photovoltaic cells 410, 420, 430 are thus formed on the substrate 405. The photovoltaic cells 410, 420, 430 are serially connected: the upper electrode Saver 413 of the photovoltaic cell 410 is connected to the lower electrode layer 421 of the photovoltaic cell 420; the upper electrode layer 423 of the photovoltaic cell 420 is connected to the lower electrode layer 431 of the photovoltaic cell 430. External electrical connections can be mounted to the lower electrode layer 411 and the upper electrode layer 433 for outputting a photovoltaic voltage that is equal to the sum of voltages produced by the serially connected photovoltaic cells 410, 420, 430 (step 680). Finally the serially connected photovoltaic cells 410, 420, 430 are sealed and packaged (step 690).

The disclosed systems and methods may include one or more of the following advantages. The disclosed systems and methods provide simpler, cleaner, and more reliable processes for manufacturing solar-cell modules or photovoltaic cells comparing to some conventional manufacturing systems. The disclosed systems and methods do not produce debris as in the patterning process in some conventional systems, as described above. The disclosed systems and methods thus can eliminate the cleaning steps for removing the debris in those conventional systems. The disclosed systems and methods also do not involve cutting thin film layers as conducted in some conventional systems. The disclosed systems and methods can thus avoid current leakage and electrical shorting in those photovoltaic cells or modules made by conventional systems. Additionally, the disclosed systems and methods do not include the roughness associated with cutting or etching on the surface after patterning in those conventional systems. The performance can thus be improved and manufacturing costs of the solar-cell modules can be reduced using the disclosed systems and methods.

Another advantage of the disclosed system and methods is that multiple layers in photovoltaic cells can be fabricated in continuous processing. The modules do not need to be disassembled for patterning and re-assembling for subsequent deposition steps as in some convention systems. Manufacturing throughput and cost are thus improved.

The disclosed systems and methods may be applied to depositions of a single thin film, two thin films, and four or more thin films. For example, a glass substrate may be supplied a continuous lower electrode before photovoltaic cell manufacturing. A laser or mechanical cutting is preformed to cut the lower electrode layer into separate lower electrodes for different photo voltaic cells. A shadow mask patterning is applied to subsequent processing.

It is understood that the disclosed process chamber is compatible with different types of processing operations such as physical vapor deposition (PVD), thermal evaporation, thermal sublimation, sputtering, chemical vapor deposition (CVD), plasma enhanced chemical vapor deposition (PECVD), ion etching, or sputter etching. The shadow mask may include different designs and patterns from the one described above. For example, a shadow mask can include non-parallel crossbars. The crossbars can be secured onto a rigid frame by different arrangements. The shadow mask can include other materials from the examples described above.

What is claimed is:

1. A substrate processing system, comprising:
a source unit configured to supply a deposition material to a substrate;
a substrate holder configured to hold a substrate to receive the deposition material;
a shadow mask comprising:
a frame that includes two opposing arms; and
a plurality of crossbars each comprising an elongated portion and a mounting member configured to be mounted to one of the two opposing arms, wherein each of the plurality of crossbars comprises a spring configured to pull the mounting member against the one of the two opposing arms to securely mount the crossbar across the two opposing arms, wherein the frame and the crossbar define a plurality of openings that are configured to pass a deposition material to a substrate; and a transport mechanism configured to produce relative movement between the shadow mask and the substrate.

2. The shadow mask of claim 1, wherein the spring and the elongated portion in the at least one of the plurality of crossbars form an integrated component.

3. The shadow mask of claim 1, wherein the spring, the mounting member, and the elongated portion in the at least one of the plurality of crossbars form an integrated component.

4. The substrate processing system of claim 1, wherein each of the plurality of crossbars comprises an elongated portion, two mounting members at two ends of the elongated portion, and a spring, wherein the mounting members are configured to be respectively mounted to the two opposing arms, wherein the spring is configured to pull the mounting member against the one of the two opposing arms to securely mount the crossbar across the two opposing arms.

5. The substrate processing system of claim 1, wherein the crossbar comprises an alloy, stainless steel, steel, Titanium, Mo, or W.

6. The substrate processing system of claim 1, wherein the frame comprises Stainless steel, steel, aluminum, titanium, or an alloy.

7. The shadow mask of claim 1, wherein a thermal expansion coefficient of the plurality of crossbars is lower than a thermal expansion coefficient of the frame.

8. The shadow mask of claim 1, wherein the plurality of crossbars has a width in a range of about 0.02 millimeter and about 2 millimeters.

9. The shadow mask of claim 1, wherein the plurality of crossbars are substantially parallel to each other.

10. The shadow mask of claim 9, wherein the plurality of crossbars are perpendicular to the two opposing arms.

11. A shadow mask for defining deposition patterns on a substrate, comprising:

a frame comprising two opposing arms; and a plurality of crossbars each comprising an elongated portion and a mounting member configured to be mounted to one of the two opposing arms, wherein each of the plurality of crossbars comprises a spring configured to pull the mounting member against the one of the two opposing arms to securely mount the crossbar across the two opposing arms, wherein the frame and the crossbar define a plurality of openings that are configured to pass a deposition material to a substrate.

12. The shadow mask of claim 11, wherein the spring and the elongated portion in the at least one of the plurality of crossbars form an integrated component.

13. The shadow mask of claim 11, wherein the spring, the mounting member, and the elongated portion in the at least one of the plurality of crossbars form an integrated component.

14. The shadow mask of claim 11, wherein each of the plurality of crossbars comprises an elongated portion, two mounting members at two ends of the elongated portion, and a spring, wherein the mounting members are configured to be respectively mounted to the two opposing arms, wherein the spring is configured to pull the mounting member against the one of the two opposing arms to securely mount the crossbar across the two opposing arms.

15. The shadow mask of claim 11, wherein the crossbar comprises an alloy, stainless steel, steel, Titanium, Mo, or W.

16. The shadow mask of claim 11, wherein the frame comprises Stainless steel, steel, aluminum, titanium, or an alloy.

17. The shadow mask of claim 11, wherein a thermal expansion coefficient of the plurality of crossbars is lower than a thermal expansion coefficient of the frame.

18. The shadow mask of claim 11, wherein the plurality of crossbars has a width in a range of about 0.02 millimeter and about 2 millimeters.

19. The shadow mask of claim 11, wherein the plurality of crossbars are substantially parallel to each other.

20. The shadow mask of claim 19, wherein the plurality of crossbars are perpendicular to the two opposing arms.

* * * * *